(12) United States Patent
Li et al.

(10) Patent No.: US 10,892,394 B2
(45) Date of Patent: Jan. 12, 2021

(54) HIGHER MANGANESE SILICIDE BASED TELLURIDE COMPOSITE FOR THERMOELECTRIC CONVERSION AND PREPARATION METHOD THEREOF

(71) Applicants: TOYOTA JIDOSHA KABUSHIKI KAISHA, Toyota (JP); TSINGHUA UNIVERSITY, Beijing (CN)

(72) Inventors: Jing-Feng Li, Beijing (CN); Zhiliang Li, Beijing (CN); Jin-Feng Dong, Beijing (CN); Shinsuke Hirono, Shizuoka-ken (JP)

(73) Assignees: TOYOTA JIDOSHA KABUSHIKI KAISHA, Toyota (JP); TSINGHUA UNIVERSITY, Beijing (CN)

( * ) Notice: Subject to any disclaimer, the term of this patent is extended or adjusted under 35 U.S.C. 154(b) by 377 days.

(21) Appl. No.: 16/043,249

(22) Filed: Jul. 24, 2018

(65) Prior Publication Data

US 2019/0067545 A1 Feb. 28, 2019

(30) Foreign Application Priority Data

Jul. 28, 2017 (CN) .......................... 2017 1 0628318

(51) Int. Cl.
*C01B 19/00* (2006.01)
*H01L 35/16* (2006.01)
*H01L 35/34* (2006.01)

(52) U.S. Cl.
CPC ............ *H01L 35/16* (2013.01); *C01B 19/007* (2013.01); *H01L 35/34* (2013.01); *C01P 2004/64* (2013.01)

(58) Field of Classification Search
CPC .................... H01L 35/16; C01B 19/007

USPC .................................................. 252/62.3 T
See application file for complete search history.

(56) References Cited

FOREIGN PATENT DOCUMENTS

JP 2009-231638 A 10/2009

OTHER PUBLICATIONS

Takahiro Yamada, et al., "Preparation of Higher Manganese Silicide (HMS) bulk and Fe-containing HMS bulk using a Na—Si Melt and their thermoelectrical properties", Thin Solid Films, 2011, 519, pp. 8524-8527.

Xi Chen, et al., "Approaching the Minimum Thermal Conductivity in Rhenium-Substituted Higher Manganese Silicides", Advance Energy Materials, 2014, vol. 4, pp. 1-10.

Guillaume Bernard-Granger, et al., "Microstructure Investigations and Thermoelectrical Properties of a P-Type Polycrystalline Higher Manganese Silicide Material Sintered from a Gas-Phase Atomized Powder", Journal of Alloys and Compounds, 2015, 618, pp. 403-412.

Yuzuru Miyazaki, et al., Crystal Structure and Thermoelectric Properties of Lightly Vanadium-Substituted Higher Manganese Silicides ($Mn_{1-x}V_x$)$Si\gamma$, Journal of Electronic Materials, 2016, vol. 46, pp. 2705-2710.

(Continued)

*Primary Examiner* — Matthew E. Hoban
(74) *Attorney, Agent, or Firm* — Sughrue Mion, PLLC

(57) ABSTRACT

Provided is a higher manganese silicide based telluride composite for thermoelectric conversion, represented by the following general formula (1):

$$(MnsSi_{1.740\pm0.015})_{1-x}(MnTe)_x \qquad (1)$$

wherein x is the molar fraction of manganese telluride in the higher manganese silicide based telluride composite for thermoelectric conversion and satisfies the relation $0<x\leq0.10$, and the maximum ZT value is 0.40 or more.

10 Claims, 3 Drawing Sheets

(56) References Cited

OTHER PUBLICATIONS

D.Y. Nhi Truong, et al., "Preparation of Pure Higher Manganese Silicides through Wet Ball Milling and Reactive Sintering with Enhanced Thermoelectric Properties", Intermetallics, 2015, vol. 66, pp. 127-132.

Wenhui Luo, et al., "Rapid Synthesis of High Thermoelectric Performance Higher Manganese Silicide with in-situ Formed Nano-Phase of MnSi", Intermetallics, 2011, vol. 19, pp. 404-408.

HIGHER MANGANESE SILICIDE BASED TELLURIDE COMPOSITE FOR THERMOELECTRIC CONVERSION AND PREPARATION METHOD THEREOF

BACKGROUND

The present invention relates to a novel material for thermoelectric conversion. Specifically, the present invention relates to a higher manganese silicide based telluride composite for thermoelectric conversion and a preparation method thereof.

Along with the rapid development of economy, traditional energy sources such as soot, petroleum, and natural gas have already been exhausted. Currently, substitutional novel energy is intensely demanded. In the utilization of energy by the activity of the humankind, 90% of the energy is generated by combustion of mineral resources. However, when traditional fossil energy is utilized, only 30% to 40% of mineral energy is converted/utilized, and the rest most of energy is dissipated as heat. Therefore, on the assumption that the traditional fossil energy can be sufficiently utilized, if 10% of waste heat is utilized, savable energy is absolutely not to a small amount. Accordingly, improving the utilization efficiency of the traditional energy is also one of the greenest technique for acquiring usable energy.

A material for thermoelectric conversion has a function to perform the mutual conversion between thermal energy and electric energy. An element using a material for thermoelectric conversion has a capability of performing temperature difference power generation on the basis of the Seebeck effect, or alternatively, a capability of achieving local cooling through energy separation based on the Peltier effect to form a temperature difference between both ends of a material. Recently, thermoelectric (TE) materials have attracted increasing attention. Thermoelectric conversion elements based on the alloys $Bi_2Te_3$, PbTe, and SiGe are applied as important elements in the technical fields such as automobile exhaust heat power generation, industrial waste heat power generation, radioisotope thermal power generation by space probe, miniaturized portable temperature difference power source, and temperature regulation of cooling semiconductors. According to studies, the thermoelectric conversion ability can be evaluated by a dimensionless performance index ZT ($ZT=S^2\sigma T/\kappa$). Herein, S, $\sigma$, $\kappa$ and T represent the Seebeck coefficient, the electric conductivity, the thermal conductivity, and the absolute temperature of the material, respectively. A desirable material for thermoelectric conversion is required to have such three conditions as a high Seebeck coefficient, a high electric conductivity, and a low thermal conductivity. However, a simultaneous satisfaction of these three conditions is the most difficult problem; even the materials currently commercialized such as $Bi_2Te_3$ and PbTe each have a ZT value of approximately 1.0. In order to obtain materials for thermoelectric conversion having excellent performances, many studies have been performed. Hereinafter, materials for thermoelectric conversion are described as classified according to the individual temperature zones. As a material for thermoelectric conversion in a low temperature zone, a Bi—Sb alloy material has been reported to be able to exhibit favorable thermoelectric conversion performances in an ultralow zone (50 to 300 K) by a study by Smith et al., in 1960s in the 20th century, and the study on the mechanism thereof has been continued. In addition, as a material for thermoelectric conversion in the vicinity of room temperature, a Bi—Te semiconductor material was reported to have a maximum ZT value in 300 to 400 K of 0.95 by a study performed by Kanatzidis et al.; the Bi—Te semiconductor material is one of the most used materials for thermoelectric conversion for use in the zone in the vicinity of room temperature. As a material for thermoelectric conversion in an intermediate temperature zone (400 to 800 K), a Pb—Te material attracts attention from many scientists, and has been applied to a temperature difference power generator in a space craft by the American National Aeronautics and Space Administration. As a material for thermoelectric conversion in a high temperature zone, an SiGe alloy is a typical material. The SiGe alloy has a ZT value at 1000 K close to 1.0, and accordingly applied in the space exploration at NASA of the United States. However, although materials for thermoelectric conversion have already been applied in specific fields, only PbTe has been applied in small scales in the intermediate temperature zone where the heat storage amounts are largest, and the ZT value (nearly 1.0) of PbTe is also unfavorable. Moreover, the Pb element is poisonous and has very high environmental harmfulness, and hence large-scale use of lead-based materials is restricted. Accordingly, the development of intermediate-temperature-zone semiconductor materials low in environmental load, low in price and high in thermoelectric conversion performances has been desired.

Higher manganese silicides are good P-type semiconductor materials for thermoelectric conversion and expected to perform waste heat power generation in an intermediately high temperature zone. Mn and Si elements contained in the higher manganese silicide material are earth-friendly, easily available, and low-cost elements. Higher manganese silicide material is one of the ideal materials as the substitutes for the intermediate-temperature-zone PbTe material, and has been widely attracting attention in the scientific community. In addition, the higher manganese silicide material has such merits as high mechanical performances, high chemical stability, high antioxidant property, and accordingly is an ideal material for industrial applications. The power factor ($PF=S^2\sigma$) of a pure-phase higher manganese silicide material is approximately $1.5\times10^{-3}$ $Wm^{-1}K^{-2}$, which is higher than the power factor of the SnSe single crystal material (PF is approximately $1.0\times10^{-3}$ $Wm^{-1}K^{-2}$) regarded to have the highest thermoelectric conversion performances, and is known to be close to the power factor of a pure-phase PbTe material. However, the ZT value of the material for thermoelectric conversion based on the higher manganese silicide is not so high. The pure-phase higher manganese silicide material has a ZT value of approximately 0.2 to 0.4 at 773 K (see, Non Patent Document 1), costly and troublesome processes such as a mechanical alloying method and a solid-phase reaction are adopted in the production process thereof, and the presence of MnSi and Si impurity phases in the final product adversely affect the thermoelectric conversion performances thereof. According to a study by Shi et al., it has been verified that the ZT value has been improved from 0.45 to 0.57 by adding a precipitate $ReSi_{1.75}$ with the diameter ranged from 50 to 200 nm to a higher manganese silicide material, (see, Non Patent Document 2). However, the Re element is a rare metal, and the production amount and the price thereof are comparable with those of Pt. Moreover, it has been verified that the ZT value can be improved up to 0.43 to 0.65 by such means as: the removal of the impurity phases such as MnSi and Si contained in the higher manganese silicide material by purification (see, Non Patent Document 3); the formation of lattice defects by element doping (see, Non Patent Document 4); the improvement of the phonon scattering in the grain boundary by refining crystal grains (see, Non Patent Document 5); and the improvement of the nano-size effect by precipitation of nano-phase (see, Non Patent Document 6). However, even these conventional techniques have left, for example, the problems that the process involved is complicated and needs cost and labor, expensive rare elements are used, and the impurity phase cannot be completely eliminated. In addition, as affairs stand now, the characteristics such as the numbers, shapes and sizes of the precipitates cannot be regulated. Therefore, it is expected that the thermoelectric conversion performances of higher manganese silicides are further improved. The ZT value of a higher manganese silicide material has not been able to be improved because the intrinsic thermal conductivity of a higher manganese silicide material is 3.0 $Wm^{-1}K^{-1}$, to be approximately eight times the intrinsic thermal conductivity of a SnSe single crystal, and approximately three to four times the intrinsic thermal conductivities of commercially available materials such $Bi_2Te_3$ and PbTe. Therefore, for the purpose of improving the thermoelectric conversion performances, there has been expected a process capable of drastically reducing the thermal conductivity while maintaining the power factor.

PRIOR ART DOCUMENTS

Non-Patent Document 1: Yamada, T.; Miyazaki, Y.; Yamane, H. Preparation of Higher Manganese Silicide (HMS) bulk and Fe-containing HMS bulk using a Na—Si Melt and their thermoelectrical properties. Thin Solid Films 2011, 519, 8524-8527.

Non-Patent Document 2: Chen, X.; Girard, S. N.; Meng, F.; Curzio, E. L.; Jin, S.; Goodenough, J. B.; Zhou, J. S.; Shi, L. Approaching the Minimum Thermal Conductivity in Rhenium-Substituted Higher Manganese Silicides. Adv. Energy Mater. 2014, 4, 1400452.

Non-Patent Document 3: Granger, G. B.; Soulier, M.; Mouko, H. I.; Navone, C.; Boidot, M.; Leforestier, J.; Simon, J. Microstructure Investigations and Thermoelectrical Properties of a P-Type Polycrystalline Higher Manganese Silicide Material Sintered from a Gas-Phase Atomized Powder. J. Alloys Compd. 2015, 618, 403-412.

Non-Patent Document 4: Miyazaki, Y.; Hamada, H.; Hayashi, K.; Yubuta, K. Crystal Structure and Thermoelectric Properties of Lightly Vanadium-Substituted Higher Manganese Silicides (Mn1-xVx) Siγ. J. Elec. Mater. 2017, 46, 2705-2710.

Non-Patent Document 5: Truong, D. Y. N.; Kleinke, H.; Gascoin, F. Preparation of Pure Higher Manganese Silicides through Wet Ball Milling and Reactive Sintering with Enhanced Thermoelectric Properties. Intermetallics 2015, 66, 127-132.

Non-Patent Document 6: Luo, W.; Li, H.; Yan, Y.; Lin, Z.; Tang, X.; Zhang, Q.; Uher, C. Rapid Synthesis of High Thermoelectric Performance Higher Manganese Silicide with in-situ Formed Nano-Phase of MnSi. Intermetallics 2011, 19, 404-408.

SUMMARY

An object of the present invention is to provide a novel material for thermoelectric conversion good in performances and a preparation method of the material for thermoelectric conversion using simple processes.

The present inventors studied the thermoelectric conversion performances of a pure-phase higher manganese silicide semiconductor, and have discovered that a higher manganese silicide has a desirable thermoelectric conversion potential capability. In addition, the present inventors further made a diligent study, and consequently discovered that the Seebeck coefficient in the temperature region of 300 to 823 K is higher in MnTe (≥300 μV/K) than in the higher manganese silicide material (≤210 μV/K), and the thermal conductivity at 773 K is much lower in MnTe (0.55 $Wm^{-1}K^{-1}$) than in the higher manganese silicide material (3.0 $Wm^{-1}K^{-1}$), and thus these two materials have a complementarity in the thermoelectric conversion parameters. Therefore, by allowing the higher manganese silicide material to contain a predetermined amount of MnTe, the thermoelectric conversion performances of the higher manganese silicide can be drastically improved. Moreover, because the melting point of MnTe is 1150° C. and corresponds to the melting point of the higher manganese silicide, MnTe and the higher manganese silicide can be concomitantly present. The present invention has been performed on the basis of the above-described studies.

According to a first aspect of the present invention, there is provided a higher manganese silicide based telluride composite for thermoelectric conversion represented by the following general formula (1):

$$(MnSi_{1.740\pm0.015})_{1-x}(MnTe)_x \qquad (1)$$

wherein x is the molar fraction of manganese telluride in the higher manganese silicide based telluride composite for thermoelectric conversion satisfies the relation, 0<x≤0.10, and a maximum ZT value of the higher manganese silicide based telluride composite for thermoelectric conversion is 0.40 or more.

According to the above-described configuration of the present invention, it is possible to obtain a novel material for thermoelectric conversion excellent in thermoelectric conversion performances.

The above-described higher manganese silicide based telluride composite for thermoelectric conversion preferably has a "nanoblock" composite structure of manganese telluride/higher manganese silicide and has a maximum ZT value of 0.55 or more.

According to the above-described configuration of the present invention, the thermoelectric conversion performances can be further improved.

According to a second aspect of the present invention, there is provided a preparation method of the higher manganese silicide based telluride composite for thermoelectric conversion, represented by the following general formula (1):

$$(MnSi_{1.740\pm0.051})_{1-x}(MnTe)_x \qquad (1)$$

wherein x is the molar fraction of manganese telluride in the higher manganese silicide based telluride composite for thermoelectric conversion and satisfies the relation, 0<x≤0.10; and a maximum ZT value of the higher manganese silicide based telluride composite for thermoelectric conversion is 0.40 or more; and the preparation method includes the following steps: obtaining a powdery raw material mixture by mixing a manganese raw material, a silicon raw material, and a tellurium raw material in a predetermined mixing ratio, and then ball milling the resulting mixture for 1 to 10 hours by using at least one selected from liquid alkanes having 5 to 7 carbon atoms as a medium; drying the powdery raw material mixture; and obtaining a higher manganese silicide based telluride composite for thermoelectric conversion by sintering the raw material mixture after drying.

According to the preparation method of the present invention, the powdery raw material mixture is obtained by ball milling for 1 to 10 hours by using at least one selected from liquid alkanes having 5 to 7 carbon atoms as a medium. In this way, there is obtained a powder in which the components are uniformized and refined, and thus the thermoelectric conversion performances of the prepared higher manganese silicide based telluride composite for thermoelectric conversion become high.

In the preparation method of the present invention, the medium is preferably at least one selected from n-pentane, n-hexane, and n-heptane.

In the preparation method of the present invention, the Te raw material is preferably Te nanowires, the diameters of the Te nanowires are preferably distributed within a range from 20 to 60 nm, and the aspect ratios of the nanowires are preferably 200 or more.

According to the above-described configuration, the prepared higher manganese silicide based telluride composite for thermoelectric conversion has a manganese telluride/higher manganese silicide "nanoblock" composite structure, and can further improve the thermoelectric conversion performances of the higher manganese silicide based telluride composite for thermoelectric conversion.

In the preparation method of the present invention, the Te nanowires are preferably Te nanowires having been subjected to a surface modification with at least one alcohol selected from alcohols having 1 to 5 carbon atoms.

According to the above-described configuration, the Te nanowires having been subjected to the surface modification can be uniformly distributed in a medium, and the manganese telluride/higher manganese silicide "nanoblock" composite structure distributed in a uniform phase can be prepared, and hence it is possible to improve the thermoelectric conversion performances of the higher manganese silicide based telluride composite for thermoelectric conversion prepared by the above-described preparation method.

In the preparation method of the present invention, the alcohols are preferably at least one selected from methanol, ethanol, propanol, butanol, and pentanol.

In the preparation method of the present invention, the sintering is preferably performed in an oxygen-free atmosphere at 950 to 1100° C.

The sintering is preferably performed at 950 to 1100° C. for 5 to 120 minutes.

According to this configuration, the oxidation of the powdery raw material mixture can be prevented, the nanowire structure can be maintained even after passing through the sintering process, and hence it is possible to utilize the phonon scattering as the nano-size effect of the nanowires in a favorable manner. In addition, according to this method, further the thermal conductivity of the higher manganese silicide based telluride composite for thermoelectric conversion can be reduced.

In the preparation method of the present invention, the sintering is preferably performed under the condition that the axial direction pressure is 20 to 100 MPa.

According to this configuration, a high electric conductivity is ensured by further controlling the porosity of the interior of a sample and density of the composite, and at the same time, the thermal conductivity of the higher manganese silicide based telluride composite for thermoelectric conversion can be reduced by improving the phonon scattering owing to the pores.

The higher manganese silicide based telluride composite for thermoelectric conversion of the present invention allows a novel material for thermoelectric conversion excellent in the thermoelectric conversion performances to be obtained.

The preferred embodiments and the advantages of the present invention can be understood by the following description.

DETAILED DESCRIPTION OF THE PREFERRED EMBODIMENTS

Figure 1:
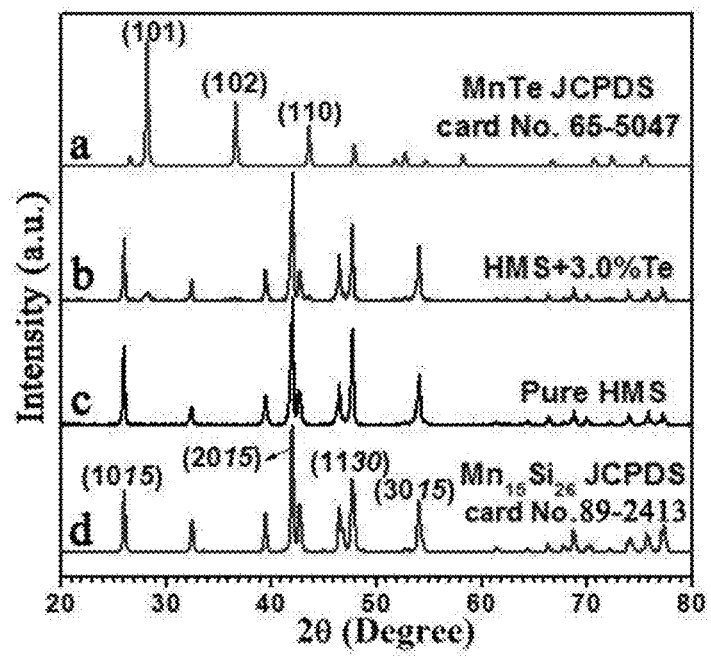
FIG. 1 shows the X-ray diffraction profile (line c) of a pure-phase higher manganese silicide prepared in Comparative Example 1, and the X-ray diffraction profile (line b) of the higher manganese silicide based telluride composite for thermoelectric conversion prepared in Example 2; the line a and the line d are the powder diffraction standard cards of MnTe and a higher manganese silicide, respectively.
Figure 2A:
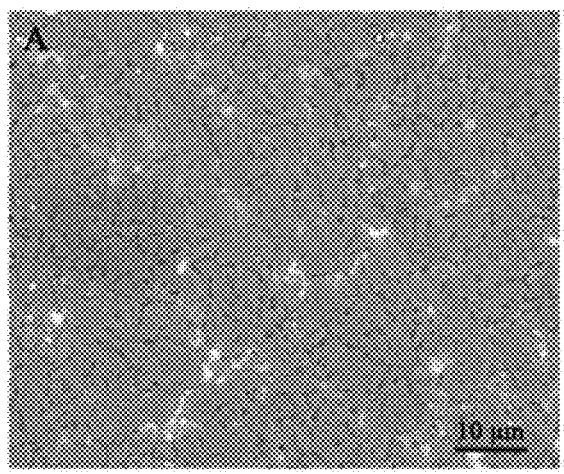
FIG. 2A is a topography of the manganese telluride/higher manganese silicide composite prepared in Example 2 of the present invention, observed with a field-emission-type scanning electron microscope.
Figure 2B:
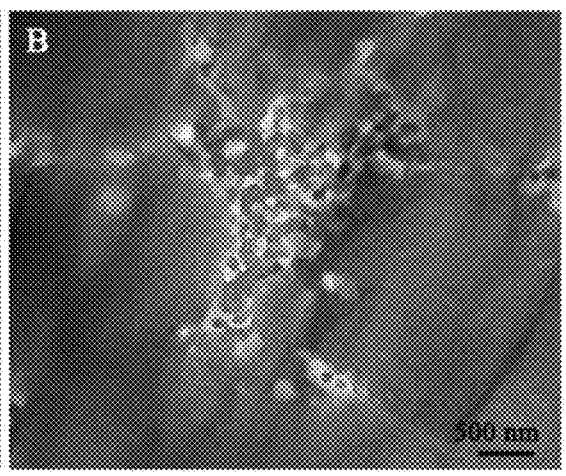
FIG. 2B is a topography of the manganese telluride/higher manganese silicide composite prepared in Example 2 of the present invention, observed with a transmission electron microscope.
Figure 3A:
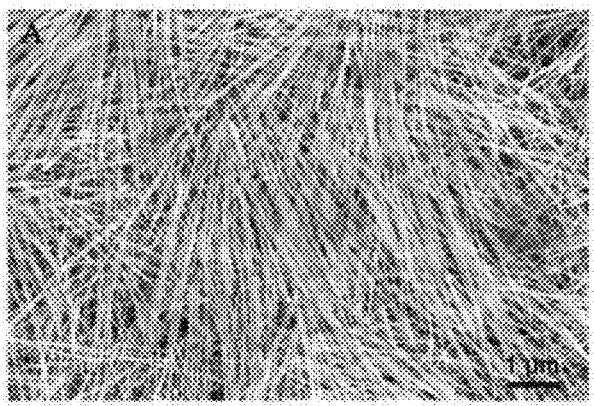
FIG. 3A shows the simple-substance Te element nanowires prepared in Example 4 of the present invention.
Figure 3B:
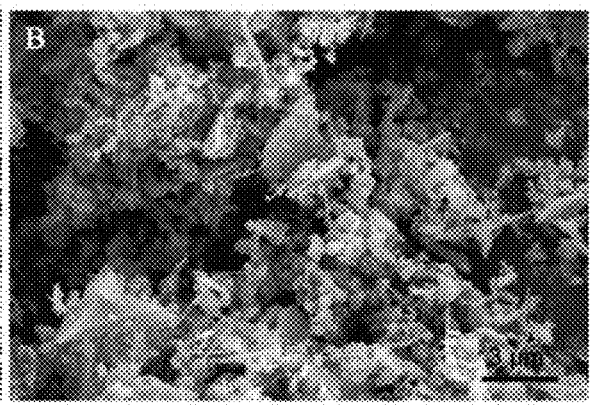
FIG. 3B shows the dispersion effect of the Te element nanowires of FIG. 3A.
Figure 4A:
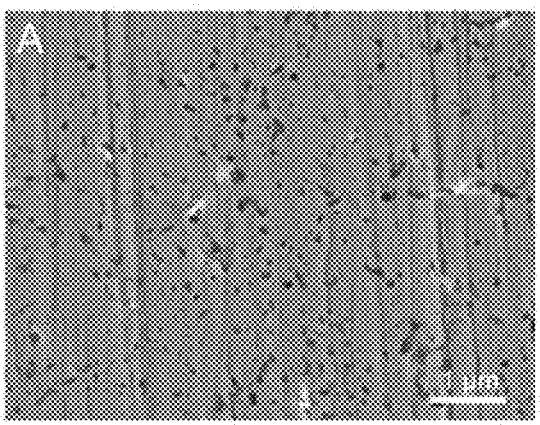
FIG. 4A is a topography of the higher manganese silicide based telluride composite for thermoelectric conversion prepared in Example 4 of the present invention having the "nanoblock" composite structure, observed with a field-emission type scanning electron microscope.
Figure 4B:
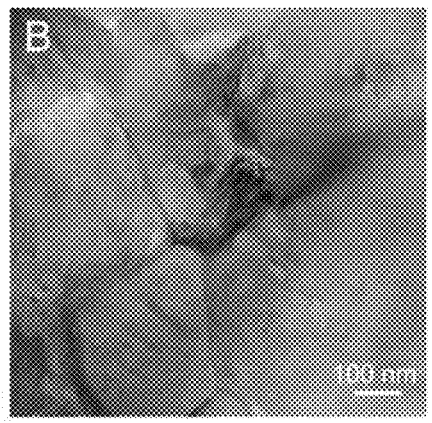
FIG. 4B is a topography of the higher manganese silicide based telluride composite for thermoelectric conversion prepared in Example 4 of the present invention having the "nanoblock" composite structure, observed with a transmission electron microscope.
Figure 5:
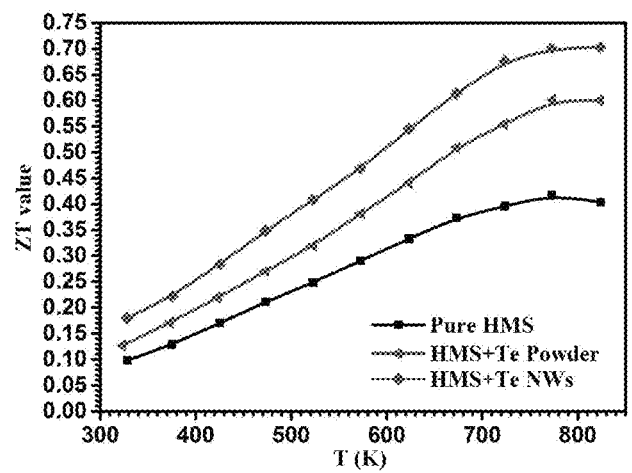
FIG. 5 is a graph showing the relation between the ZT value and the temperature in each of the pure-phase higher manganese silicide prepared in Comparative Example 1, and the manganese telluride/higher manganese silicide composite and the manganese telluride/higher manganese silicide "nanoblock" composite prepared in Example 2 and Example 4, respectively.

Hereinafter, the present invention will be described in detail by way of Examples. The cases of Examples are shown in the drawings. It is to be noted that from beginning to end, the homologous or similar symbols represent the homologous or similar elements, or represent elements having homologous or similar performances. Hereinafter, Examples are described with reference to the accompanying drawings. These Examples are merely illustrative examples used for interpreting the present invention, and do not limit the present invention.

The present invention relates to a higher manganese silicide based telluride composite for thermoelectric conversion. The higher manganese silicide based telluride composite for thermoelectric conversion has the chemical composition represented by the following general formula: $(MnSi_{1.740\pm0.015})_{1-x}(MnTe)_x$. Here, x represents the molar fraction of manganese telluride in the higher manganese silicide based telluride composite for thermoelectric conversion and satisfies the relation, $0<x\leq0.10$.

The higher manganese silicide semiconductor has an excellent thermoelectric conversion potential capability, but is remarkably affected by the thermoelectric conversion performances of the higher manganese silicide material, depending on the content of MnTe. When the content of MnTe is too large, because the electric conductivity of the material steeply decreases, the numerator in the ZT value formula is also made small. Consequently, the thermoelectric conversion performances of the higher manganese silicide material are remarkably lowered. However, the molar fraction of MnTe in the higher manganese silicide based telluride composite for thermoelectric conversion is larger than 0 and 0.10 or less, the thermoelectric conversion performances of the higher manganese silicide based telluride composite for thermoelectric conversion can be improved. This is probably because the MnTe semiconductor has a high intrinsic Seebeck coefficient ($\geq 300$ $\mu VK^{-1}$) and a low thermal conductivity ($\leq 0.55$ $Wm^{-1}K^{-1}$). By allowing the Te element to be contained in an appropriate amount, the Seebeck coefficient can be improved, and the thermal conductivity of the higher manganese silicide material can be effectively reduced, and hence the thermoelectric conversion performances can be drastically improved. When the Te element micron powder is replaced with the Te nanowires, a final product having a uniformly distributed "nanoblock" structure is obtained. In this way, while the energy filter effect is being further increased, the Seebeck coefficient comes to be large. Moreover, because the production of nano precipitate of MnTe widens the phonon scattering wavelength range, the thermal conductivity can be further decreased, and it is possible to obtain a higher manganese silicide based telluride composite for thermoelectric conversion, having high thermoelectric conversion performances.

Examples of the higher manganese silicide based telluride composite for thermoelectric conversion include: $(MnSi_{1.740+0.015})_{0.095}(MnTe)_{0.005}$, $(MnSi_{1.740\pm0.015})_{0.990}(MnTe)_{0.010}$, $(MnSi_{1.740\pm0.015})_{0.980}(MnTe)_{0.020}$, $(MnSi_{1.740\pm0.015})_{0.970}(MnTe)_{0.030}$, $(MnSi_{1.740\pm0.015})_{0.960}(MnTe)_{0.040}$, $(MnSi_{1.740\pm0.015})_{0.950}(MnTe)_{0.050}$, $(MnSi_{1.740\pm0.015})_{0.925}(MnTe)_{0.075}$, and $(MnSi_{1.740\pm0.015})_{0.90}(MnTe)_{0.10}$.

Examples of the higher manganese silicide based telluride composite for thermoelectric conversion, having a "nanoblock" structure include: $(MnSi_{1.740\pm0.015})_{0.995}(MnTe_{NWs})_{0.005}$, $(MnSi_{1.740\pm0.015})_{0.990}(MnTe_{NWs})_{0.010}$, $(MnSi_{1.740\pm0.015})_{0.980}(MnTe_{NWs})_{0.020}$, $(MnSi_{1.740\pm0.015})_{0.970}(MnTe_{NWs})_{0.030}$, $(MnSi_{1.740+0.015})_{0.960}(MnTe_{NWs})_{0.040}$, $(MnSi_{1.740\pm0.015})_{0.950}(MnTe_{NWs})_{0.050}$, $(MnSi_{1.740\pm0.015})_{0.925}(MnTe_{NWs})_{0.075}$, and $(MnSi_{1.740\pm0.015})_{0.90}(MnTe_{NWs})_{0.10}$. It is to be noted that "$_{NWs}$" is the abbreviation for nanowires.

According to specific Examples of the present invention, when the relation $0<x\leq 0.10$ is satisfied, MnTe is contained in the chemical composition of the higher manganese silicide based telluride composite for thermoelectric conversion, and hence the maximum ZT value in the range from room temperature to 550° C. is 0.40 to 0.60.

According to one embodiment of the present invention, when the higher manganese silicide based telluride composite for thermoelectric conversion has the manganese telluride/higher manganese silicide "nanoblock" composite structure, the lowest thermal conductivity thereof can be reduced down to 1.85 $Wm^{-1}K^{-1}$ or less, and the maximum ZT value can be improved up to 0.55 to 0.70.

Hereinafter, the present invention is described with reference to specific Examples. It is to be noted that these Examples are illustrative examples and do not limit the present invention.

<Preparation of Higher Manganese Silicide Based Telluride Composite for Thermoelectric Conversion>

The higher manganese silicide based telluride composite for thermoelectric conversion is prepared by the following steps.

(1) Mixing step: Analytical reagent grade raw materials of Mn, Si and Te are weighed in a weight ratio of 10.9990: 10.1134 to 9.1021:0 to 2.5522 and mixed.

(2) Wet ball milling step: The raw material mixture obtained above is placed in a ball mill, and subjected to ball milling for 1 to 10 hours by using a liquid alkane having 5 to 7 carbon atoms as a medium.

(3) Drying step: the powdery raw material mixture is placed in a vacuum dryer and dried at a temperature of 40 to 100° C. for 2 to 12 hours.

(4) Preliminary sintering step: The sufficiently dried powder is placed in a mold, the mold charged with the powder is placed in a spark plasma sintering machine, the powder is heated up to 300 to 400° C. under an axial direction pressure of 20 to 100 MPa, and the powder is preliminarily sintered in a vacuum atmosphere for 5 to 120 minutes.

(5) High-temperature sintering step: The preliminarily sintered sample is successively heated to 950 to 1100° C. under an axial direction pressure of 20 to 100 MPa in an oxygen-free atmosphere and sintered for 5 to 120 minutes. In this way, the higher manganese silicide based telluride composite for thermoelectric conversion represented by the general formula $(MnSi_{1.740\pm0.015})_{1-x}(MnTe)_x$ is prepared. Herein, the relation $0<x\leq 0.10$ is satisfied.

The Mn raw material and the Si raw material are not particularly limited, as long as the Mn raw material and the Si raw material are analytical reagent grade element powders of Mn and Si, respectively.

Examples of the Te raw material include a Te element micron powder or Te nanowires. Here, the Te nanowires are preferable.

The Te nanowires may be prepared by a conventional chemical method. Preferably, the Te nanowires are the Te nanowires having been subjected to a surface modification with at least one alcohol selected from the alcohols having 1 to 5 carbon atoms. When the Te nanowires are subjected to a surface modification with an alcohol, the Te nanowires can be dispersed uniformly in a medium, and hence it is possible to prepare a higher manganese silicide based telluride composite for thermoelectric conversion in which MnTe is uniformly distributed in the higher manganese silicide.

Moreover, the diameters of the Te nanowires are preferably 20 to 60 nm, and the aspect ratios of the Te nanowires are preferably 200:1 or more. When the diameters of the nanowires are within the above-described range, the diameters are approximately coincident with the mean free path of the phonons, and hence such diameters are advantageous for the occurrence of the particle diffraction phenomenon, the improvement of the phonon scattering effect, and the decrease of the crystal lattice thermal conductivity of the material. When the diameters of the nanowires exceed 60 nm, the nano-size effect is not sufficiently exhibited and the mobility of the charge carrier decreases, and hence the electric conductivity of the material drastically decreases, and the power factor of the material is reduced, which is not favorable. Aspect ratios of the nanowires that are 200 or more are favorable for the formation of the network structure in the interior of the material, and allowing the linear capture effect to be effectively exhibited for the transportation of the phonons further reduces the crystal lattice thermal conductivity.

Examples of the above-described alcohol include methanol, ethanol, propanol, butanol, and pentanol; and methanol, ethanol, propanol, n-butanol, and n-pentanol are preferable. These alcohols may be used each alone or in combinations of two or more thereof.

Examples of the liquid alkane having 5 to 7 carbon atoms include: n-pentane, isopentane, neopentane, n-hexane, 2-methylpentane, 3-methylpentane, 2,3-dimethylbutane, 2,2-dimethylbutane, n-heptane, 2-methylhexane, 3-methylhexane, 2,2-dimethylpentane, 3,3-dimethylpentane, 2,3-dimethylpentane, 2,4-dimethylpentane, 3-ethylpentane, and 2,2,3-trimethylbutane. These may be used, as the medium, each alone or in combinations of two or more thereof. Herein, n-pentane, n-hexane, and n-heptane are preferable.

By performing ball milling in the presence of the above-described medium, it is possible to prevent the oxidation of the element raw material such as the Mn powder, the Si powder, the Te powder or the Te nanowires, and at the same time, it is possible to obtain a powder in which the component is uniformized and refined. In addition, when the Te nanowires are used, it is possible to obtain a manganese telluride/higher manganese silicide "nanoblock" composite structure distributed in a uniform phase. Accordingly, it is possible to further improve the thermoelectric conversion performances of the higher manganese silicide based telluride composite for thermoelectric conversion.

The above-described high-temperature sintering is preferably performed in an oxygen-free atmosphere at 950 to 1100° C. In addition, the high-temperature sintering is also more preferably performed at a temperature of 950 to 1100° C. for 5 to 120 minutes. This is because the sintering in an oxygen-free atmosphere can prevent the oxidation of the powdery raw material mixture, and the nanowire structure is maintained even after passing through the sintering process. In addition, the sintering performed at 950 to 1100° C. increases the purity of the product. When the sintering temperature is lower than 950° C., the reaction does not proceed sufficiently and the impurity phases of MnSi and/or a Si element tend to be produced. Moreover, because the aforementioned impurity phases cannot be removed even by annealing, the thermoelectric conversion performances are significantly adversely affected in an unfavorable manner. When the sintering temperature is higher than 1100° C., the higher manganese silicide particles are fused to increase the particle sizes and to decrease the crystal grain boundary, and accordingly, the phonon scattering due to the crystal grain boundary or the lattice defects is not sufficient. Consequently, the thermal conductivity remarkably increases and the ZT value decreases, which is not favorable.

The above-described high-temperature sintering is preferably performed under an axial direction pressure of 20 to 100 MPa. When the axial direction pressure is within the above-described range, it is further possible to control the porosity in the interior of the sample and the density of the composite. Accordingly, a high electric conductivity is ensured, and at the same time, the thermal conductivity of the higher manganese silicide based telluride composite for thermoelectric conversion can be decreased by improving the phonon scattering by utilizing the pores. When the axial direction pressure is lower than 20 MPa, the porosity increases and the denseness of the material is insufficient, and accordingly the electric conductivity drastically decreases. When the axial direction pressure is higher than 100 MPa, the density of the material increases and the porosity of the material decreases, and hence it is impossible to scatter the phonons by efficiently utilizing pores. Consequently, the thermal conductivity of the material increases, which is not favorable.

<Measurement of Thermoelectric Conversion Performance>

By the above-described preparation method, there was prepared a higher manganese silicide based telluride composite for thermoelectric conversion in a circular sheet shape having a diameter of 6 to 20 mm and a thickness of 6 to 10 mm. Next, by subjecting the circular sheet to cutting and polishing treatments, a circular sheet having a diameter of 6 mm or 10 mm and a thickness of 1 to 1.5 mm (perpendicular to the sintering pressure direction) was obtained. Then, the thermal conductivity ($\kappa$) was measured under the condition that the temperature range was 300 to 823 K.

By subjecting the circular sheet obtained by the above-described method to cutting and polishing treatments, there was obtained a rectangular sample (parallel to the sintering pressure direction) having a length×a height×a width=7×2.5×2.5 mm$^3$. Then, the electric performances such as the electric conductivity ($\sigma$) and the Seebeck coefficient (S) were measured under the condition of a temperature range from 300 to 823 K.

Next, by introducing the parameters measured as described above into the mathematical expression $ZT=S^2\sigma T/\kappa$, the ZT value of the material was calculated. Here, S, $\sigma$, T and $\kappa$ represent the Seebeck coefficient, the electric conductivity, the temperature and the electric conductivity of the material, respectively. In this way, the thermoelectric conversion performances of the material were evaluated.

Hereinafter, Examples and Comparative Example of the present invention are described. The Mn powder, the Si powder and the Te element micron powder used in Examples and Comparative Example are all the products of Shanghai Aladdin Biochemical Technology Co., Ltd.

COMPARATIVE EXAMPLE 1

Raw materials: 10.9990 g of Mn Powder and 10.1134 g of Si Powder.

Preparation method: The weighed Mn powder and Si element powder were placed in a 250-mL ball mill, 50 mL of n-hexane was added, and the resulting mixture was subjected to ball milling for 2 hours. Next, the powdery raw material mixture was placed in a vacuum drier and dried at a temperature of 60° C. for 2 hours. Then, the sufficiently dried powder was placed in a spark plasma sintering machine, heated to 350° C., and preliminarily sintered in a vacuum atmosphere for 20 minutes. The mixed powder obtained by the preliminary sintering was successively, under an axial direction pressure of 60 mPa, heated to 1050° C., and sintered for 10 minutes. Finally, there was obtained a circular sheet having a diameter of 15 mm and a thickness of 7 mm. In this way, there was prepared a higher manganese silicide material for thermoelectric conversion, represented by a general formula, $MnSi_{1.740\pm0.015}$. The aforementioned higher manganese silicide material for thermoelectric conversion gave the maximum ZT value at a temperature of 773 K and the maximum ZT value was 0.40.

EXAMPLE 1

Raw materials: 10.9990 g of Mn powder, 10.1134 g of Si powder, and 0.1276 g of Te element micron powder.

Preparation method: A sample was prepared in the same manner as in Comparative Example 1. In this way, there was prepared a higher manganese silicide based telluride composite for thermoelectric conversion, represented by a general formula, $(MnSi_{1.740\pm0.015})_{0.995}(MnTe)_{0.005}$. The aforementioned higher manganese silicide based telluride composite for thermoelectric conversion gave the maximum ZT value at a temperature of 773 K and the maximum ZT value was 0.44.

EXAMPLE 2

Raw materials: 10.9990 g of Mn powder, 9.8100 g of Si powder, and 0.7657 g of Te element micron powder.

Preparation method: A sample was prepared in the same manner as in Example 1. In this way, there was prepared a higher manganese silicide based telluride composite for thermoelectric conversion, represented by a general formula, $(MnSi_{1.740\pm0.015})_{0.97}(MnTe)_{0.03}$. The aforementioned higher manganese silicide based telluride composite for thermoelectric conversion gave the maximum ZT values at temperatures of 773 K and 823 K and the maximum ZT values were 0.60.

EXAMPLE 3

Raw materials: 10.9990 g of Mn powder, 9.1020 g of Si powder, and 2.5522 g of Te element micron powder.

Preparation method: A sample was prepared in the same manner as in Example 1. In this way, there was prepared a higher manganese silicide based telluride composite for thermoelectric conversion, represented by a general formula, $(MnSi_{1.740\pm0.015})_{0.90}(MnTe)_{0.10}$. The aforementioned higher manganese silicide based telluride composite for thermoelectric conversion gave the maximum ZT value at a temperature of 823 K and the maximum ZT value was 0.50.

EXAMPLE 4

Raw materials: 10.9990 g of Mn powder, 9.8100 g of Si powder, and 0.7657 g of Te nanowires.

The preparation method of the Te nanowires is as follows. In a 500 ml-volume three-necked flask, 2.8728 g of $TeO_2$ and 3.6 g of polyvinylpyrrolidone were dispersed in a 300 mL of an ethylene glycol solvent, and the resulting dispersion was heated to 170° C. while the dispersion was being stirred with a magnetic stirrer. Then, 1 mL of hydrazine hydrate was added to the dispersion and the resulting mixture was allowed to react for 45 minutes; then the reaction mixture was centrifuged, and thus a colloid of the Te nanowires was obtained. The colloid was washed with deionized water and ethanol alternately three times, and finally dried to obtain a Te nanowire powder. The Te nanowires have diameters of approximately 35 nm and aspect ratios of 200:1 or more.

The preparation method of the higher manganese silicide based telluride composite for thermoelectric conversion is shown below. The weighed Mn element powder and the weighed Si element powder were placed in a 250 ml ball mill, 50 mL of n-hexane was added, the resulting mixture was subjected to ball milling for 2 hours, and thus a mixture of the Mn element and the Ti element was obtained. For the purpose of subjecting the Te nanowires to a surface modification, weighed Te nanowires were preliminarily dispersed in 20 mL of absolute ethanol and dispersed with ultrasonic wave for 20 minutes. Then, to the dispersion liquid, 30 mL of n-hexane was added, the resulting mixture was successively dispersed with ultrasonic wave for 20 minutes, and thus a uniform-phase Te nanowire colloid solution was formed. Then, the Te nanowire colloid solution was added to the mixture composed of the Mn element and the Si element, and the resulting mixture was once more subjected to ball milling for 20 minutes. After ball milling, the raw material mixture was placed in a vacuum drier, and was dried at a temperature of 60° C. for 2 hours. Then, the sufficiently dried powder was charged in a column-shaped graphite mold, the graphite mold was placed in a spark plasma sintering machine, the powder was heated to 350° C. under an axial direction pressure of 60 MPa, and the powder was preliminarily sintered in a vacuum atmosphere for 20 minutes. The sample obtained by the preliminary sintering was successively heated to 1050° C. under an axial direction pressure of 60 MPa, and sintered for 10 minutes. Finally, there was obtained a circular sheet having a diameter of 15 mm and a thickness of 7 mm. In this way, there was prepared a higher manganese silicide based telluride composite for thermoelectric conversion, represented by a general formula $(MnSi_{1.740\pm0.015})_{0.97}(MnTe_{NWs})_{0.03}$ and having a "nanoblock" structure. The aforementioned higher manganese silicide based telluride composite for thermoelectric conversion gave the maximum ZT values at temperatures of 773 K and 823 K and the maximum ZT values were 0.70.

EXAMPLE 5

Raw materials: 10.9990 g of Mn powder, 10.0123 g of Si powder, and 0.2552 g of Te nanowires.

Preparation method: A sample was prepared in the same manner as in Example 4. In this way, there was prepared a higher manganese silicide based telluride composite for thermoelectric conversion, represented by a general formula $(MnSi_{1.740\pm0.015})_{0.99}(MnTe_{NWs})_{0.01}$. The aforementioned higher manganese silicide based telluride composite for thermoelectric conversion gave the maximum ZT value at a temperature of 823 K and the maximum ZT value was 0.55.

EXAMPLE 6

Raw materials: 10.9990 g of Mn powder, 9.6077 g of Si powder, and 1.2761 g of Te nanowires.

Preparation method: A sample was prepared in the same manner as in Example 4. In this way, there was prepared a higher manganese silicide based telluride composite for thermoelectric conversion, represented by a general formula $(MnSi_{1.740\pm0.015})_{0.95}(MnTe_{NWs})_{0.05}$. The aforementioned higher manganese silicide based telluride composite for thermoelectric conversion gave the maximum ZT value at a temperature of 823 K and the maximum ZT value was 0.62.

EXAMPLE 7

Raw materials: 10.9990 g of Mn powder, 9.8100 g of Si powder, and 0.7657 g of Te nanowires.

Preparation method: A sample was prepared in the same manner as in Example 5 except that methanol was used in place of the absolute ethanol in which the Te nanowires were dispersed. In this way, there was obtained a higher manganese silicide based telluride composite for thermoelectric conversion, represented by the general formula $(MnSi_{1.740\pm0.015})_{0.97}(MnTe_{NWs})_{0.03}$. The aforementioned higher manganese silicide based telluride composite for thermoelectric conversion gave the maximum ZT value at a temperature of 823 K and the maximum ZT value was 0.69.

EXAMPLE 8

Raw materials: 10.9990 g of Mn powder, 9.8100 g of Si powder, and 0.7657 g of Te nanowires.

Preparation method: A sample was prepared in the same manner as in Example 5 except that n-propanol was used in place of the absolute ethanol in which the Te nanowires were dispersed. In this way, there was obtained a higher manganese silicide based telluride composite for thermoelectric conversion, represented by the general formula $(MnSi_{1.740\pm0.015})_{0.97}(MnTe_{NWs})_{0.03}$. The aforementioned higher manganese silicide based telluride composite for thermoelectric conversion gave the maximum ZT value at a temperature of 823 K and the maximum ZT value was 0.68.

EXAMPLE 9

Raw materials: 10.9990 g of Mn powder, 9.8100 g of Si powder, and 0.7657 g of Te nanowires.

Preparation method: A sample was prepared in the same manner as in Example 5 except that n-butanol was used in place of the absolute ethanol in which the Te nanowires were dispersed. In this way, there was obtained a higher manganese silicide based telluride composite for thermoelectric conversion, represented by the general formula $(MnSi_{1.740\pm0.015})_{0.97}(MnTe_{NWs})_{0.03}$. The aforementioned higher manganese silicide based telluride composite for thermoelectric conversion gave the maximum ZT value at a temperature of 823 K and the maximum ZT value was 0.68.

EXAMPLE 10

Raw materials: 10.9990 g of Mn powder, 9.8100 g of Si powder, and 0.7657 g of Te nanowires.

Preparation method: A sample was prepared in the same manner as in Example 5 except that n-pentanol was used in place of the absolute ethanol in which the Te nanowires were dispersed. In this way, there was obtained a higher manganese silicide based telluride composite for thermoelectric conversion, represented by the general formula $(MnSi_{1.740\pm0.015})_{0.97}(MnTe_{NWs})_{0.03}$. The aforementioned higher manganese silicide based telluride composite for thermoelectric conversion gave the maximum ZT value at a temperature of 823 K and the maximum ZT value was 0.67.

EXAMPLE 11

Raw materials: 10.9990 g of Mn powder, 9.8100 g of Si powder, and 0.7657 g of Te element micron powder.

Preparation method: A sample was prepared in the same manner as in Example 1 except that the sintering temperature was set at 950° C. In this way, there was prepared a higher manganese silicide based telluride composite for thermoelectric conversion, represented by the general formula $(MnSi_{1.3740\pm0.015})_{0.97}(MnTe)_{0.03}$. The aforementioned higher manganese silicide based telluride composite for thermoelectric conversion gave the maximum ZT value at a temperature of 773 K and the maximum ZT value was 0.58.

EXAMPLE 12

Raw materials: 10.9990 g of Mn powder, 9.8100 g of Si powder, and 0.7657 g of Te element micron powder.

Preparation method: A sample was prepared in the same manner as in Example 1 except that the sintering pressure was set at 100 MPa. In this way, there was prepared a higher manganese silicide based telluride composite for thermoelectric conversion, represented by the general formula $(MnSi_{1.740\pm0.015})_{0.97}(MnTe)_{0.03}$. The aforementioned higher manganese silicide based telluride composite for thermoelectric conversion gave the maximum ZT value at a temperature of 773 K and the maximum ZT value was 0.59.

Example 13

Raw materials: 10.9990 g of Mn powder, 9.8100 g of Si powder, and 0.7657 g of Te element micron powder.

Preparation method: A sample was prepared in the same manner as in Example 1 except that the ball milling time was set at 10 hours. In this way, there was prepared a higher manganese silicide based telluride composite for thermoelectric conversion, represented by the general formula $(MnSi_{1.740\pm0.015})_{0.97}(MnTe)_{0.03}$. The aforementioned higher manganese silicide based telluride composite for thermoelectric conversion gave the maximum ZT value at a temperature of 773 K and the maximum ZT value was 0.55.

EXAMPLE 14

Raw materials: 10.9990 g of Mn powder, 9.8100 g of Si powder, and 0.7657 g of Te element micron powder.

Preparation method: A sample was prepared in the same manner as in Example 1 except that n-pentane was used in place of n-hexane. In this way, there was prepared a higher manganese silicide based telluride composite for thermoelectric conversion, represented by the general formula $(MnSi_{1.740\pm0.015})_{0.97}(MnTe)_{0.03}$. The aforementioned higher manganese silicide based telluride composite for thermoelectric conversion gave the maximum ZT value at a temperature of 773 K and the maximum ZT value was 0.58.

EXAMPLE 15

Raw materials: 10.9990 g of Mn powder, 9.8100 g of Si powder, and 0.7657 g of Te element micron powder.

Preparation method: A sample was prepared in the same manner as in Example 1 except that n-heptane was used in place of n-hexane. In this way, there was prepared a higher manganese silicide based telluride composite for thermoelectric conversion, represented by the general formula $(MnSi_{1.740\pm0.015})_{0.97}(MnTe)_{0.03}$. The aforementioned higher manganese silicide based telluride composite for thermoelectric conversion gave the maximum ZT value at a temperature of 7773 K and the maximum ZT value was 0.57.

Above-described Examples of the present invention may be modified as follows.

In the above-described embodiments, a low-temperature preliminary sintering is performed, but the low-temperature preliminary sintering may be omitted and only the high-temperature sintering may be performed.

The terms described in the present description such as "one Example," "a plurality of Examples," "a case," "a specific case," or "a plurality of cases" that the specific features, structures, and materials or features described in the aforementioned Examples or the aforementioned cases intend to be included at least in one Example or one case. In addition, in the present description, the aforementioned terms do not intend to necessarily limit to the same Example and the same case. Moreover, the described specific features, structures, materials or features can be appropriately combined in any one or any pluralities of Examples or cases. It is to be understood that Examples of the present invention have already been disclosed as described above, but are provided for the purpose of presenting illustrative examples, and do not intend to limit the present invention. Within the scope of the present invention not departing from the principle and gist of the present invention, those skilled in the art can change, modify, replace and transform above-described Examples.

The invention claimed is:

1. A higher manganese silicide based telluride composite for thermoelectric conversion represented by the following general formula (1):

$$(MnSi_{1.740\pm0.015})_{1-x}(MnTe)_x \quad (1)$$

wherein x is the molar fraction of manganese telluride in the higher manganese silicide based telluride composite for thermoelectric conversion and satisfies the relation $0<x\leq0.10$, and a maximum ZT value of the higher manganese silicide based telluride composite for thermoelectric conversion is 0.40 or more.

2. The higher manganese silicide based telluride composite for thermoelectric conversion according to claim 1, wherein the composite has a manganese telluride/higher manganese silicide nanoblock composite structure, and the maximum ZT value is 0.55 or more.

3. A preparation method of a higher manganese silicide based telluride composite for thermoelectric conversion represented by the following general formula (1):

$$(MnSi_{1.740\pm0.015})_{1-x}(MnTe)_x \quad (1)$$

wherein x is the molar fraction of manganese telluride in the higher manganese silicide based telluride composite for thermoelectric conversion and satisfies the relation $0<x\leq0.10$, and a maximum ZT value of the higher manganese silicide based telluride composite for thermoelectric conversion is 0.40 or more; and the preparation method comprising the following steps:

obtaining a powdery raw material mixture by mixing a manganese raw material, a silicon raw material, and a tellurium raw material in a predetermined ratio and then ball milling the resulting mixture for 1 to 10 hours by using at least one selected from liquid alkanes having 5 to 7 carbon atoms as a medium;

drying the powdery raw material mixture; and obtaining the higher manganese silicide based telluride composite for thermoelectric conversion by sintering the raw material mixture after drying.

4. The preparation method of a higher manganese silicide based telluride composite for thermoelectric conversion according to claim 3, wherein the medium is at least one selected from n-pentane, n-hexane and n-heptane.

5. The preparation method of a higher manganese silicide based telluride composite for thermoelectric conversion according to claim 3, wherein the Te raw material is Te nanowires, the diameters of the Te nanowires are distributed in a range from 20 to 60 nm, and the aspect ratios of the Te nanowires are 200 or more.

6. The preparation method of a higher manganese silicide based telluride composite for thermoelectric conversion according to claim 5, wherein the Te nanowires have been subjected to a surface modification with at least one selected from alcohols having 1 to 5 carbon atoms.

7. The preparation method of a higher manganese silicide based telluride composite for thermoelectric conversion according to claim 6, wherein the alcohols are at least one selected from methanol, ethanol, propanol, butanol, and pentanol.

8. The preparation method of a higher manganese silicide based telluride composite for thermoelectric conversion according to claim 5, wherein the sintering is performed in an oxygen-free atmosphere at 950 to 1100° C.

9. The preparation method of a higher manganese silicide based telluride composite for thermoelectric conversion according to claim 3, wherein the sintering is performed at 950 to 1100° C. for 5 to 120 minutes.

10. The preparation method of a higher manganese silicide based telluride composite for thermoelectric conversion according to claim 3, wherein the sintering is performed under a condition that the axial direction pressure is 20 to 100 MPa.

* * * * *